United States Patent [19]

Spaeder et al.

[11] Patent Number: 5,229,725
[45] Date of Patent: Jul. 20, 1993

[54] ELECTRICAL FAULT DETECTOR IN REMOTE SYSTEMS USING A SATURABLE CORE

[75] Inventors: William J. Spaeder, Havertown; John C. Grebe, Norristown, both of Pa.

[73] Assignee: Moore Products Co., Spring House, Pa.

[21] Appl. No.: 864,517

[22] Filed: Apr. 7, 1992

[51] Int. Cl.⁵ .............................................. G01R 31/08
[52] U.S. Cl. ........................................ 324/522; 324/509; 340/651
[58] Field of Search ............... 324/509, 522, 541, 544, 324/536, 529, 117 R; 340/651

[56] References Cited

U.S. PATENT DOCUMENTS

| | | | |
|---|---|---|---|
| 2,832,046 | 4/1938 | Rezek | 324/117 R |
| 3,308,345 | 9/1964 | Warrington | 318/18 |
| 3,996,513 | 12/1976 | Butler | 324/62 |
| 4,021,729 | 5/1977 | Hudson | 324/51 |
| 4,037,155 | 7/1977 | Ahmed | 324/133 |
| 4,096,539 | 6/1978 | Scaturro | 361/93 |
| 4,114,089 | 9/1978 | Ahmed | 324/509 |
| 4,234,900 | 11/1980 | Miyazaki et al. | 361/45 |
| 4,371,832 | 2/1983 | Wilson et al. | 340/651 |
| 4,385,271 | 5/1983 | Kurtz et al. | 324/509 |
| 4,929,035 | 5/1990 | Saigo et al. | 324/522 |

Primary Examiner—Jack B. Harvey
Assistant Examiner—Maura K. Regan
Attorney, Agent, or Firm—Synnestvedt & Lechner

[57] ABSTRACT

Imbalances between currents to and from a remote point are detected by passing the outgoing currents and the return current through different, oppositely-oriented coils on a saturable core, and an excitation current is applied to another coil in the same core sufficient to drive the core into saturation in at least one direction. When the outgoing and return currents are the same, the excitation produces successive voltage pulses of the same durations, as measured by an up-down counter; if an imbalance is present, the remainder in the up-down counter shows this. To detect excessively high imbalances, which might place the core always in saturation, another counter preferably senses the sum of the widths of successive pulses, and indicates an imbalance if this sum falls below a preselected threshold.

8 Claims, 4 Drawing Sheets

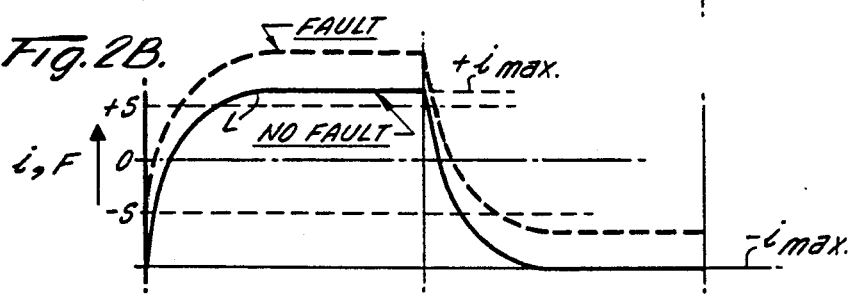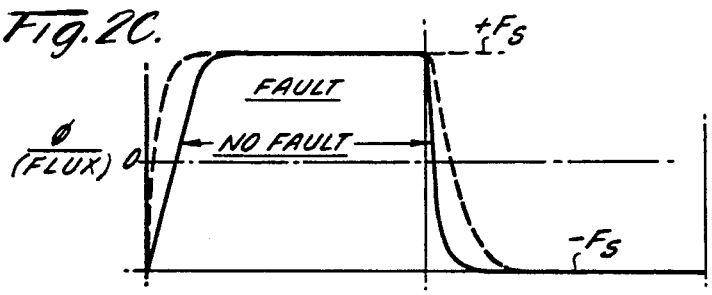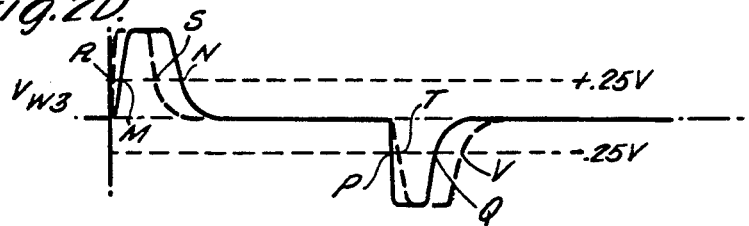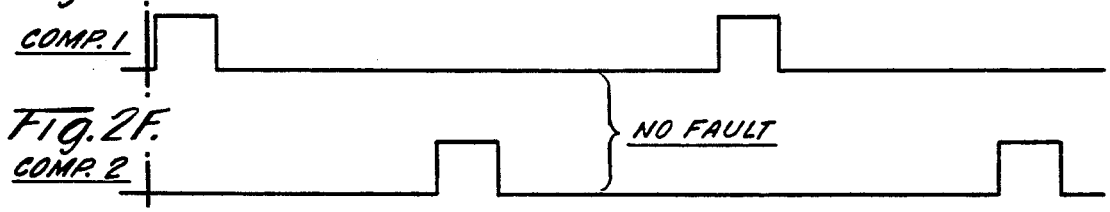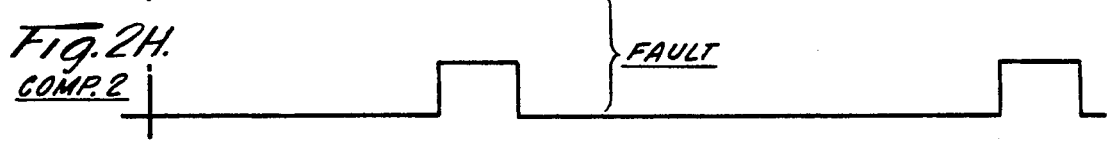

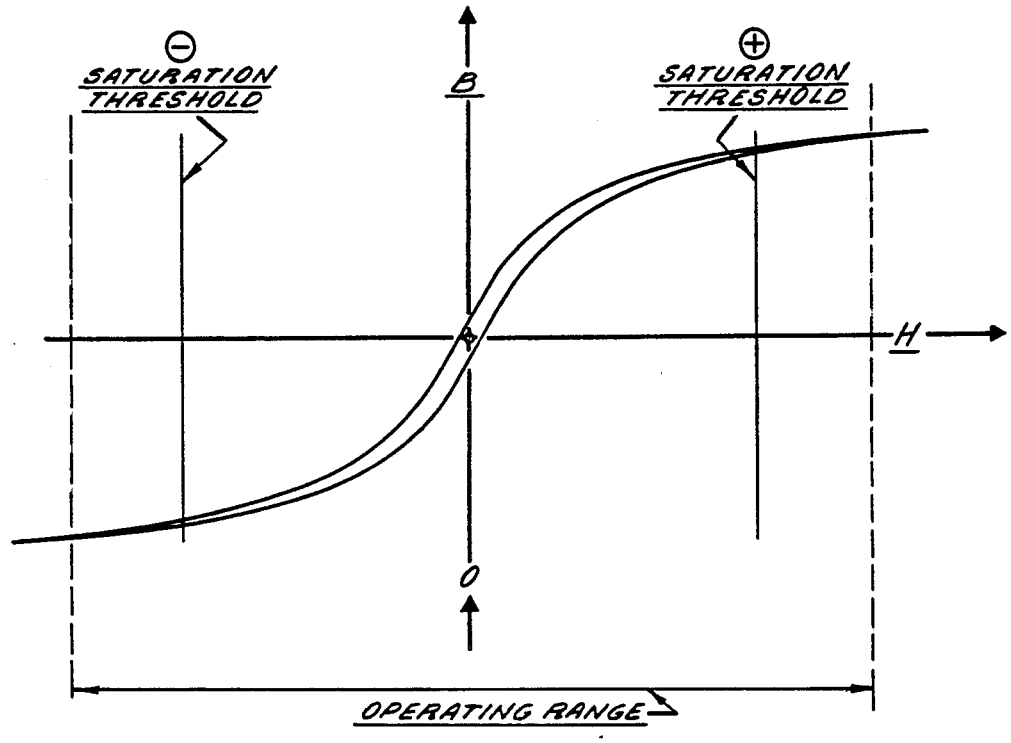
Fig. 3. NO GROUNDFAULT
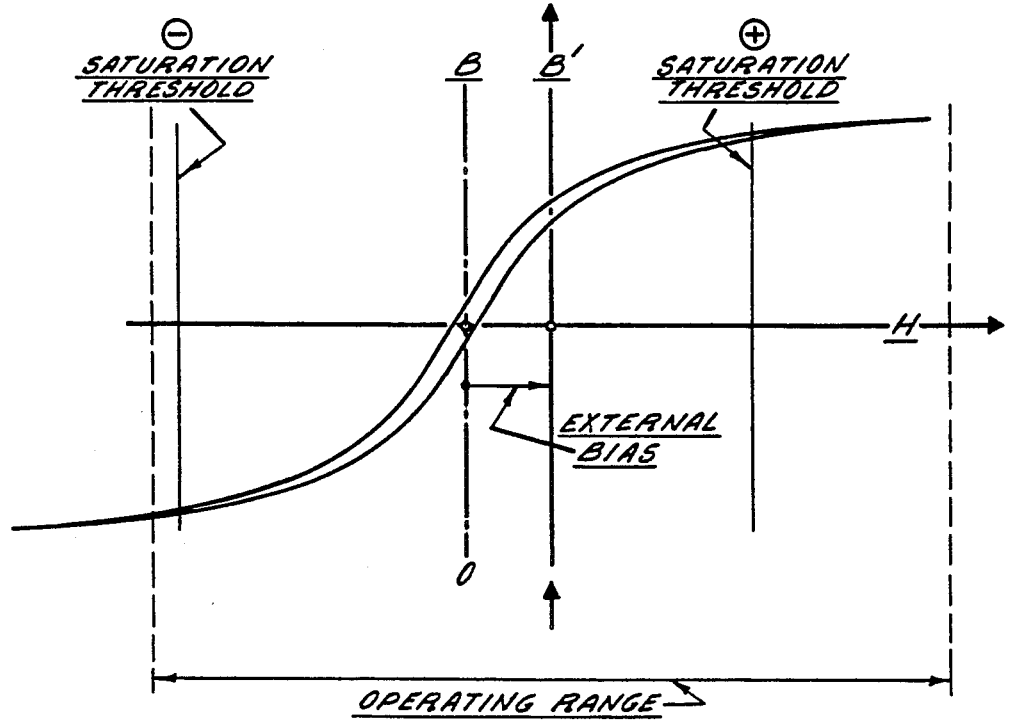
Fig. 4. GROUNDFAULT

ELECTRICAL FAULT DETECTOR IN REMOTE SYSTEMS USING A SATURABLE CORE

FIELD OF THE INVENTION

This invention relates to electrical fault detectors, and particularly to those which are useful in detecting and indicating electrical circuit faults in a monitored DC system connected thereto in a series loop by comparing the current flow to the monitored system with the current returning from the monitored system, such differences being used to detect the presence of a fault.

BACKGROUND OF THE INVENTION

A common class of device for detecting electrical faults in a remote system involves sensing the current flowing to the remote system and the current flowing back from the remote system to see if they are the same. In certain types of such arrangements, the over-all circuit is what is commonly designated as a series loop, in that current is supplied from a central station to a remote measuring apparatus, whence it flows back to the central station, with any difference between the outgoing and returning currents representing a fault, such as a flow to ground of current within the remote system or in the leads extending to or from it.

One form of apparatus intended to effect such fault detection is described in U.S. Pat. No. 4,371,832 of Gerald L. Wilson, issued Feb. 1, 1983. In that apparatus the current flowing out to a remote monitoring device is passed through a coil on a toroidal magnetic core and the return current is passed through another coil on the same core, but in the opposite relative direction with respect to the core. If there is no fault present the two currents will be equal, and will produce no net magnetization of the core; however, should there be a fault, these two currents will differ and will produce an imbalance resulting in a net magnetization of the core in one direction or the other, depending on which current is the larger; typically, a ground fault causes the return current to be smaller than the outgoing current.

The U.S. Pat. No. 4,371,832 cited above is concerned with apparatus for detecting such imbalances when they occur. To accomplish this detection, an excitation coil is provided on the same core as that on which the outgoing current coil and the incoming current coil are located, to which excitation coil an excitation voltage of alternating polarity is applied; the applied voltage is caused to reverse at the times when the current through the excitation coil causes the core to reach a magnetic saturation level in one direction or the other. The frequency or duty cycle of the excitation voltage is then measured, and utilized as an indication of current balance or imbalance, and hence of the absence or presence of a fault.

While useful for certain purposes, the system of the U.S. Pat. No. 4,371,832 patent does suffer from the drawback that the system output is in the form of a pulse train of varying frequency, complicating the subsequent digital circuitry which interprets the output of the system.

It is desirable to provide a fault detector system in which the input excitation voltage and the output pulse voltages are all of the same common frequency, simplifying the subsequent digital circuitry which interprets the output of the system.

SUMMARY OF THE INVENTION

According to the present invention, the excitation voltage for the core is a voltage wave applied through resistive means to the excitation coil to produce corresponding pulses of charging current in the excitation coil, in alternating opposite directions; each of these charging current pulses starts in response to a reversed polarity of the input voltage wave, and the current pulses are of sufficient magnitude to drive the core into flux saturation in at least one sense, and preferably in both opposite senses. The system then compares the response of the core to successive charging current pulses of opposite polarities, and thus determines whether a fault is present. In a preferred embodiment, the current pulses drive the core into saturation in both directions, and the system measures the successive time intervals required for the core to change from flux saturation in one sense to flux saturation in the other sense; if these intervals are substantially equal to each other in duration, no fault is present, while if a fault is present they differ substantially.

In a preferred embodiment, comparison of the durations of the charging time intervals required for the flux to change from one saturation level to the other is accomplished by producing pulses having widths corresponding to the durations of these time intervals, and supplying these pulses to a device, preferably an up-down counter, which produces an output signal indicative of when the count remaining after each up-down counting cycle differs from zero by more than a predetermined threshold amount; this output signal indicates that a fault exists.

Accordingly, the desired detection of faults is provided by a system which generates fault-indicating output pulses of a constant frequency the same as that of the excitation signal supplied to the excitation coil on the core.

BRIEF DESCRIPTION OF FIGURES

These and other objects and features of the invention will be more readily understood from a consideration of the following detailed description, taken in connection with the accompanying drawings, in which:

FIGS. 2A through H comprise a set of graphical representations illustrating operations occurring in this system when no fault is present and when a fault is present;

FIGS. 3 and 4 are graphical representations to which reference will be made in describing the operation of a preferred embodiment of the invention.

DETAILED DESCRIPTION OF PREFERRED EMBODIMENTS

Figure 1:
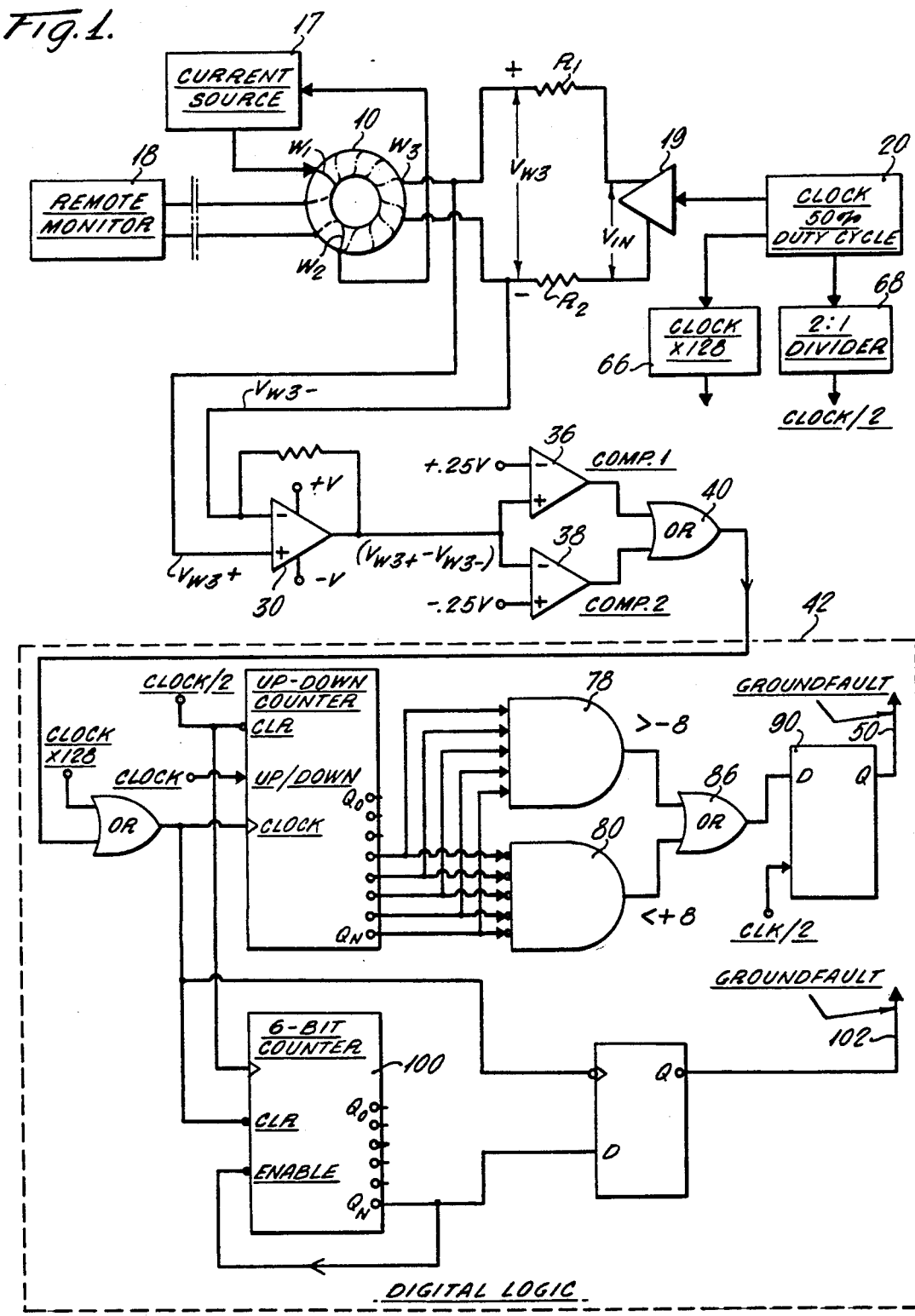
FIG. 1 is a schematic drawing of an electrical fault detector in accordance with a preferred embodiment of the present invention.

Referring to the preferred embodiment of the invention shown in the FIG. 1, a toroidal magnetic core 10, which may be a conventional manganese zinc core, is provided with three windings W1, W2 and W3. W1 is a single-turn coil through which current from a current source 17, such as a central monitoring station, is passed on its way to a remote parameter-monitoring station 18, for example. Current return coil W2 is also of a single turn, arranged identically in parallel with coil W1, and is of the same wire size; the return current from the remote monitoring point is passed through the return coil W2, on its way to the central monitoring station, in the opposite sense relative to the current through the source-current coil. The excitation coil W3 typically comprises a plurality of turns (e.g. 400) on the core 10 and is supplied with a regular, periodic excitation voltage from excitation voltage source 19, for example with a rectangular wave at a frequency of about 256 Hz. This excitation voltage is supplied to one end of the coil W3 in a first phase by way of series resistor R1, and to the other end of the coil W3 in the opposite phase by way of a series resistor R2, of the same value as resistor R1. Excitation coil W3 is thereby provided with a regular, periodic charging current which is alternating in nature in that it flows in one sense through the excitation coil during one polarity of the applied input voltage and in the opposite sense during the other polarity of applied input voltage; in this example it recurs at the frequency of a 50% duty-cycle clock signal supplied from clock 20.

Referring now to FIGS. 2A to 2H, at A of FIG. 2 there is shown the rectangular periodic wave of voltage appearing between the input end of resistor R1 and the input end of resistor R2, and labeled $V_{IN}$; it varies positively to a voltage $+V_{supply}$, and negatively to a minus voltage denoted as $-V_{supply}$. Starting at time $t_0$ the positive portion of this rectangular voltage wave charges the inductance of the excitation coil W3 positively, as shown in the solid-line curve portion L of FIG. 2B for the case where no fault is present, the current rising substantially exponentially to a final value $i_{max}$ equal to $V_{IN}$ divided by the sum of the resistances of resistors R1 and R2 and the resistance of the excitation coil W3. When the input voltage changes to its negative value as shown at $t_1$ in FIG. 2A, the excitation coil W3 is first discharged and then charged in the negative sense until it reaches the minimum current value $-i_{max}$. This alternate charging and discharging of the inductance of the excitation coil W3 continues periodically, each alternate charging beginning in phase with the start of the corresponding input voltage pulse. This current is proportional to the ampere-turns and magnetomotive force F acting on the core due to the excitation coil current.

In this example the swinging of the excitation current i between its maximum and minimum values is sufficient to drive the core 10 into magnetic saturation in both senses, the currents at which saturation occurs being indicated in FIG. 2B by the broken lines $+S$ and $-S$.

FIG. 2C shows schematically and approximately, in solid-line, the corresponding values of the magnetic flux in the magnetic core, to an arbitrary vertical scale; While the flux typically lags the current slightly, in general it rises to the level at which the core is magnetically saturated, shown as $+F_s$ in FIG. 2C, remains at this saturation level until the current is reduced below the saturation level of current sufficiently to reduce the flux below saturation, reverses its direction of change, and increases in the negative sense until negative flux saturation is reached at $-F_s$.

The voltage $V_{W3}$ across the excitation coil is equal to the time rate of change of the magnetic flux therein, and is generally as depicted in FIG. 2D in idealized form; the line N shows the voltage with no fault present.

Thus, for example, while the flux is increasing rapidly as shown at the beginning of the solid-line graph of FIG. 2C, the voltage across the excitation coil is at a relatively high level. As the core begins to reach saturation, the rate of change of flux, and hence the voltage, decreases rapidly, and when full saturation is reached, the voltage becomes and remains substantially zero, until the current of FIG. 2B begins to go negative sufficiently to decrease the flux in the core and change it in the opposite or negative polarity. As is shown in FIG. 2D, the negative-going flux of FIG. 2C then produces a relatively high level of negative voltage which continues during the downward transition of flux; when negative saturation is achieved, the voltage falls back toward zero, where it remains during saturation until the next positive pulse of input voltage occurs. For the case where no fault is present, this results in the series of positive and negative voltage pulses shown in solid line in FIG. 2D, and formed by differential amplifier 30 in FIG. 1.

Positive and negative threshold levels of $V_{W3}$ are shown as $+0.25$ volts and $-0.25$ volts in FIG. 2D, and define the times M at which the voltage from amplifier 30 rises to the positive threshold level $+25$ V and the times N at which it falls again to this level, respectively. The time interval between M and N is then used as a measure of the duration of the time interval required for $V_{W3}$ to go from negative saturation to positive saturation in the absence of a fault, and correspondingly the time interval between P and Q is used as a measure of the duration of the time required for the voltage to go from positive saturation to negative saturation, with no fault present. This action is provided by differential amplifiers 36 and 38, supplied with $V_{W3}$ of FIG. 2D, one at its plus input and the other at its minus input terminal. Amplifier 36 is also provided at its negative input terminal with the $+0.25$ V threshold bias, and amplifier 38 is similarly supplied at its plus input terminal with the $-0.25$ V bias. Accordingly, amplifier 36 produces on line COMP. 1 the output voltage pulses shown at FIG. 2E, and amplifier 38 produces on line COMP. 2 the pulses shown at FIG. 2F, for no-fault-present. It is noted that these two sets of pulses are equal in width. They are applied through OR circuit 40 to a digital logic comparator 42 which compares the widths of the pulses of the two sets by counting up in response to each pulse shown in FIG. 2E and counting down in response to each succeeding pulse of FIG. 2F. If the result is zero or near-zero, this is an indication that there is n fault present.

However, if the remaining count after a count-up and a succeeding count-down is substantial, this is an indication of the presence of a fault; this latter situation is depicted in FIGS. 2G and 2H, which show the difference in widths of the pulses on the COMP. 1 line and on the COMP. 2 line with a fault present; the pulses on COMP. 1 line have become narrower and the pulses on COMP. 2 line wider, due to the shift in the value of the flux in the core caused by the difference in current to and from the remote monitoring system when a fault is present. A threshold is preferably provided in, or following, the counter which measures the pulses widths, so that the difference between each two successive pulse widths, and the corresponding remanent pulse count, must be above a certain threshold value to cause an alarm, thereby to minimize false alarms.

More particularly, when a fault is present the input voltage and the charging current due to W3, are the same as before as shown in FIGS. 2A and 2B, but the total ampere-turns differs as shown by the broken line in FIG. 2B, due to the imbalance current caused by the fault. The flux, as shown in the broken line in FIG. 2C, also differs, especially in that it rises towards its maximum value more rapidly than when no fault is present, and falls back from that value more slowly than when no fault is present. The effect of this is shown in broken line in FIG. 2D, wherein the time interval between the time R when the positive pulse first exceeds the level 0.25 V and the time S at which it subsequently first falls to that level is smaller than the corresponding interval M-N occurring when no fault is present; the corresponding time interval between T and V for the negative pulse is greater when no fault is present than when there is no fault. As explained above, these times are measured by the digital logic 42. Thus when these successive pulses of different pulse widths are applied to the digital logic 42, a substantial remanent count exists after each up-count, down-count cycle, which is interpreted as a fault, and a corresponding fault-indicating voltage is produced on output line 50.

In the presently preferred embodiment, the digital logic 42 for performing the pulse width comparison is as will now be described.

The pulse signals of various widths are supplied from OR circuit 40 to the input of another OR circuit 52, the other input terminal of which is supplied with a periodic pulse signal at 128 times the clock pulse frequency from the "CLOCK ×128" shown at 66, and the output of OR 52 is supplied to the "clock" input of up-down counter 60. This counter has a CLEAR terminal supplied with CLEAR signals at ½ clock frequency, from 2:1 divider 68; this clears the counter after each successive pair of pulses from OR 52, so that pulses are compared as to width in pairs. Counter 60 also has an UP-DOWN input terminal to which clock signals are supplied, which cause the counter to start counting up in response to one pulse at its UP/DOWN input terminal and to start counting down in response to the next pulse at its UP/DOWN input terminal.

In response to a pulse on the COMP. 1 line, for example, the counter 60 counts up by the number of "clock×128" pulses applied to it during the pulse whose width is to be measured, and then stops counting; the clock signal at the UP/DOWN input terminal then switches the counter to count down, and if the next successive pulse from the COMP. 2 line is of the same width, it counts back to zero, and a binary count of zero is then presented at counter output terminals Q3 through Q7. If the two successive pulses are of different widths, after the UP-DOWN count there will be a remanent count or remainder; if the absolute value of this remanent count is 8 or greater, in this example, it produces a fault indication on output line 50.

This "thresholding" of the output count avoids triggering the fault detection system for small remanent counts (less than 8) which may represent false alarms. The thresholding is provided by applying the outputs from Q3 through Q7 to both of a pair of AND gates 78 and 80; gate 80 responds by producing an output only in response to negative counts, while gate 78 responds only to positive counts. It requires a count of 8 to activate all of the 5 outputs Q3–Q7 and hence produce an output from either of the gates 78 or 80. The thresholded outputs of the AND gates 78 and 80 are then supplied through OR gate 86 to a flip-flop 90, which is toggled to its ground-fault indicating state only when either gate 78 or 80 produces an output.

Accordingly, indication of a fault is derived by measuring and comparing differences between the time interval required for the core 10 to go from negative to positive saturation, and the time interval required for it to go from positive saturation to negative saturation. While very accurate indications of faults are provided by thus comparing these two time intervals with each other, it is also possible but generally less satisfactory to obtain fault sensing by measuring the duration of either of the two time intervals and comparing that measured interval with a standard interval corresponding to the no-fault conditions.

FIGS. 3 and 4 indicate the magnetization in the toroidal core under conditions of fault-present and no-fault, respectively. FIG. 3 depicts the usual hysteresis type curve of core 10, in which H (representing field strength, and proportional to coil current) is plotted against B, the magnetic induction or flux in the core 10. Shown in that drawing is the "operating range", representing the extent of the swing of applied magnetic field H, corresponding to the swing of current in the excitation coil, which in this example substantially exceeds the swing necessary to drive the core into plus and minus saturation even when a substantial fault is present. The operating range of current swing is symmetrically positioned with respect to the hysteresis characteristic when no fault is present, as shown in FIG. 3.

However, when a substantial ground fault is present, the conditions change to those represented by FIG. 4. Here the current level designated "external bias" represents the unbalanced current due to the difference between the outgoing and return currents in the corresponding two coils on the core, when a fault occurs. The operating range of total H acting on the core will then swing symmetrically about this external bias level as shown, again driving the core into positive and negative saturation. However, because of the external magnetic bias due to the current imbalance, the time required for the flux to reach the saturation level in a positive direction is shortened while that required for it to reach the saturation level in the negative direction is increased, as discussed previously with respect to the other graphs. This produces the above-described differences in the time durations of successive voltage pulses across the coil, and a corresponding electrical indication of a fault.

Accordingly, there has been described a fault detector of the class employing a magnetic toroid provided with an excitation coil, an outgoing-current coil and a return-current coil, in which periodic excitation current is applied to the excitation coil and periodic voltage output pulses are produced across the excitation coil, one alternate set of the output pulses having a duration corresponding to the time required for the flux to go from negative to positive saturation and the other set comprising pulses having durations corresponding to the times required for the flux to go from positive saturation to negative saturation; differences between these time intervals are detected and compared, to produce indications of whether or not a fault is present.

The foregoing detailed description assumes that the core is driven into saturation in both senses by the excitation voltage and current even in the presence of a fault. However, this is not the case in all applications of the invention. For example, the imbalanced current may be large enough that the excitation current drives the core into saturation in only one sense, in which case the system will still operate to indicate faults properly. In another case, the imbalance current may be even larger, so that the excitation current at one extreme of its excursion drives the core far into saturation, and at its other extreme drives the core out of saturation but not far enough to reverse the flux direction, in which case the system will also work. However, if the imbalance current is exceedingly large so that the core never gets out of saturation in one direction, the COMP 1 and COMP 2 signals which should indicate a fault become very small and, when used as described above, fail to indicate a fault.

To provide the desired fault indication in the latter condition of very high imbalance current, the circuit shown in the lower portion of the digital logic block in FIG. 1 is preferably used. It serves to determine the sum of the widths of the COMP 1 and COMP 2 pulses; if that sum falls below a preselected threshold value, a fault is indicated by this additional circuitry, even though the remaining circuit fails to do so.

More particularly, referring to FIG. 1, the pulses from OR gate 52 are also supplied to the CLOCK input terminal of an UP-UP counter 100, which is cleared every other pulse by the same CLOCK/2 signal which is supplied to the CLEAR terminal of the UP-DOWN counter 60. UP-UP counter 100 counts up during both of each pair of successive COMP pulses, to give a count proportional to the sum of the widths of the two pulses. If this sum is below a preselected threshold value, it toggles flip-flop 104 to produce an output on its Q output line 102 indicating a fault. When the imbalance is less, UP-UP counter will always count up to the threshold level, say 32, in response to each successive pair of COMP pulses, supplying this count over line 108 to hold flip-flop 104 in its no-fault state; a return line 86 extends from the output of UP-UP counter 100 to the ENABLE input of the latter counter to reset it, thereby to prevent the counter from counting so high that it exceeds its top limit and begins to count again at zero. A CLEAR line 120, supplied with CLOCK/2 pulses, resets the UP-UP counter after each pair of COMP pulses.

FIGS. 5A through 5F illustrate the type of operation resulting as the imbalance current increases from zero in one sense; the opposite sense of imbalance produces a directly analogous operation.

Figure 5A:
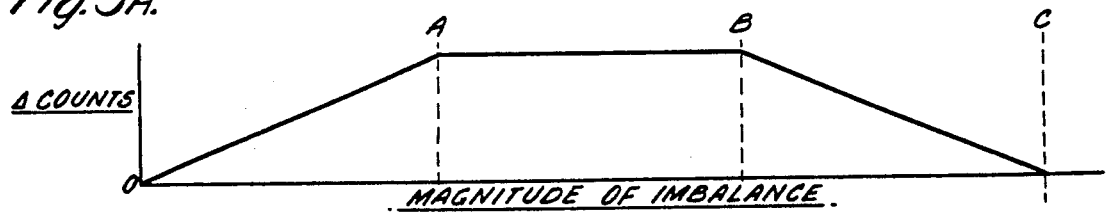
FIGS. 5A, 5B, 5C, 5D and 5E are graphical representations useful in explaining certain aspects of the operation of the invention.
Figure 5B:
Figure 5C:
Figure 5D:
Figure 5E:
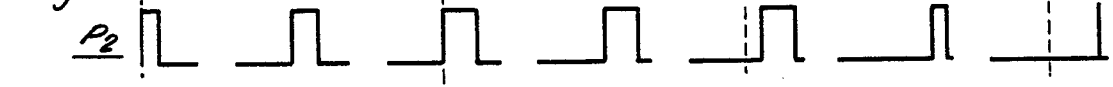

Referring to FIG. 5A, the difference or differential between the up and down counts in counter 60, representing the difference between the widths of the COMP 1 and COMP 2 pulses, is plotted as ordinates against the magnitude of the imbalance current as abscissae. The first range of imbalance currents extending from O to A represents the case in which the center of the operating range through which the core flux cycles is below the core saturation point, the core flux swinging progressively further into saturation in one direction and correspondingly less in the opposite direction; the differential count in counter 60 therefore increases more or less linearly; the corresponding change in relative widths is shown in FIGS. 5D and 5C, representing, respectively, the widths of the COMP 1 and COMP 2 output pulses (P1 and P2), starting out with equal widths at zero imbalance and with P2 becoming increasingly wider and P1 progressively narrower for increasing imbalance. The corresponding excitation voltage $V_{in}$ is also plotted to the same scale of time, for reference.

When the imbalance reaches point A in FIG. 5A, the center of the operating range is at the saturation point in one direction, and the pulses P1 in FIG. 5D, which have been progressively decreasing in width, disappear essentially entirely since the core is already in saturation and a further swing in applied field cannot saturate the core any further. As shown in FIG. 5D, the P2 pulses meanwhile retain a substantially constant width throughout the region A to B in FIG. 5A, and the differences in count stays essentially constant in this region.

However, when the point B of FIG. 5A is reached the imbalance current becomes so great that the swing of the excitation voltage no longer moves the core into saturation in the opposite sense (to the left in the Figure), and the amount by which it swings out of saturation at all become progressively smaller. As a result, the P1 pulses remain at zero and the P2 pulses begin to decrease toward zero with further increases in imbalance current. As the widths of both P1 and P2 approach zero, their difference also approaches zero. Accordingly, even though the imbalance is then very great, the difference in pulse widths of P1 and P2 approach zero, as does the differential remanent count produced by the UP-DOWN counter. Therefore, the greatest imbalance tends to produce no indication of a fault.

To guard against this situation, it is preferred to include in the system of the invention means for sensing the sum of the widths of the successive pairs of P1 and P2 pulses. This sum is shown, idealized, in FIG. 5B. In the region O to A, the sum is essentially constant, since as P1 gets narrower, P2 gets wider. In the region A to B, the P1 pulses stay at zero width while the P2 pulses stay at a relative constant value. In the range of increasing current imbalance represented at B to C, the P1 pulses remain at zero and the P2 pulses reduce toward O, producing the decrease toward zero of their sums as shown at the right in FIG. 5B, giving no fault indication on output line 50 (FIG. 1).

To overcome the disappearance of a fault indication on line 50, the above-described means in the form of 6-bit counter 100 produces a fault indication on output line 102 when the sum of the widths of the P1 and P2 pulse falls below a predetermined level as indicated for example by an UP-UP count of 7 or less. Accordingly, for pulse width differences due to imbalances in the range from O to B in FIGS. 5A and 5B, line 50 provides the fault indication; for larger imbalances line 102 produces the fault indication. If desired, these two outputs can be applied to an OR circuit to produce a single fault indication for any degree of imbalance current.

Figure 6:
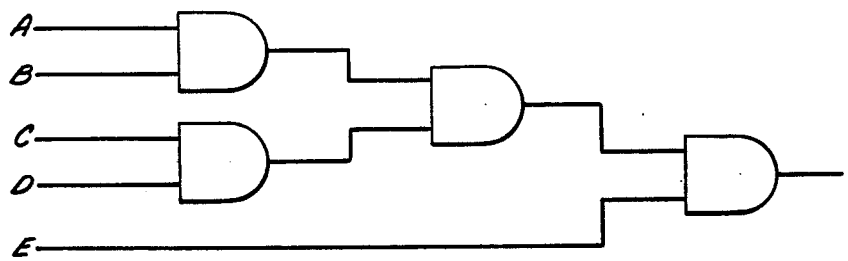
FIGS. 6 and 7 are schematic diagrams of gates useful in the system of FIG. 1, as described hereinafter.

FIG. 6 shows a 5-input AND gate suitable for use as AND gate 78 in FIG. 1; as is clear, a HIGH at all of the input lines A through E is necessary to produce a HIGH output on line 122.

Figure 7:
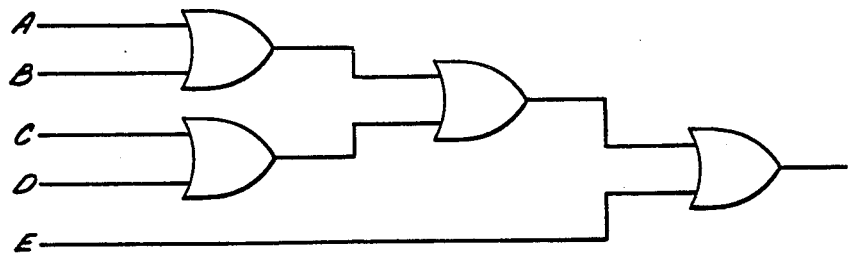

FIG. 7 shows a 5-input gate suitable for use as gate 80 in FIG. 1; it is clear that a LOW at any of its 5 input lines will make its output on line 130 go LOW.

Accordingly, the system of the invention will detect an imbalance of either polarity, i.e. a return current larger or smaller than the outgoing current.

It is not necessary to use a rectangular 50%-duty cycle excitation voltage, although it is preferable that the excitation wave be symmetrical in the amount of energy in its positive and negative phases, at least where the system is intended to produce fault indications whenever the two currents are unequal; in other uses in which it is normal for the currents to be in some ratio other than 1:1, e.g. 2:1, one may choose to use a counter-balancing imbalance in the symmetry of the excitation wave.

While an excitation frequency of 256 Hz is mentioned above as an example, different frequencies may be used so long as the core magnetization can change fast enough to follow the excitation wave; frequencies into the tens of thousands of kilohertz are contemplated. In addition, the currents compared may be alternating currents, rather than direct currents, in which case the AC frequency is preferably an integral multiple of the excitation signal frequency. Further, the measurement of pulse width need not be by counting pulse duration; for example, one may instead compare the energies of the COMP 1 and COMP 2 pulses.

Thus, while the invention has been described with particular reference to specific embodiments in the interest of complete definiteness, it will be understood that it may be embodied in a variety of forms diverse from those specifically shown and described, without departing from the spirit and scope of the invention.

We claim:

1. In a fault detector for detecting electrical circuit faults in a remote system connected thereto, comprising means for passing an outgoing current to said remote system and for receiving an incoming current from said remote system, said outgoing and incoming currents bearing a known relationship to each other in the absence of a fault in said remote system and differing from said relationship when a fault is present in said remote system, a saturable magnetic core, first coil means on said core responsive to said outgoing current and said incoming current to produce in said core a corresponding magnetic flux of a sense and magnitude dependent upon the sense and magnitude of any differences between said outgoing and incoming currents, and excitation coil means on said core responsive to a varying excitation voltage applied thereto to produce currents therein sufficient to drive said core intermittently into magnetic saturation in at least one sense, the improvement wherein:

said fault detector comprises a source of excitation voltage comprising a voltage wave and resistive means connecting said source to said excitation coil to produce corresponding pulses of charging current in said excitation coil in alternately opposite directions, each of said current pulses starting substantially in phase with a reversal of polarity of said voltage wave and at least one of said current pulses increasing at least until it produces flux saturation in said core, the response of said core to successive ones of said current pulses differing depending upon the level of flux established in said core by said first coil means; and said fault detector comprises means for measuring said response of said core.

2. In a fault detector for detecting electrical circuit faults in a remote system connected thereto, comprising means for passing an outgoing current to said remote system and for receiving an incoming current from said remote system, said outgoing and incoming currents being substantially equal in the absence of a fault in said remote system and differing from each other when a fault is present in said remote system, a saturable magnetic core, first coil means on said core responsive to said outgoing current and said incoming current to produce in said core a magnetic flux of a sense and magnitude dependent upon the sense and magnitude of any differences between said outgoing and incoming currents, and excitation coil means on said core responsive to a varying excitation voltage applied thereto to produce currents sufficient to drive said core into magnetic saturation alternately in opposite magnetic directions, the improvement wherein:

said fault detector comprises a source of excitation voltage comprising a periodic substantially rectangular voltage wave and resistive means connecting said source to said excitation coil to produce corresponding periodic pulses of charging current in said excitation coil in alternately opposite directions, each of said current pulses starting in phase with a reversal of polarity of said rectangular voltage wave and each of said current pulses increasing at least until it produces flux saturation in said core, whereby the time intervals required for said core to change from flux saturation in one sense to flux saturation in the other sense depend upon the level of flux established in said core by said first coil means; and said fault detector comprises means for measuring said time intervals.

3. The fault detector of claim 2, wherein said first coil means further comprises a pair of coils on said core, one supplied with some said outgoing current and one with said incoming current, said coils being such as to produce substantially zero net magnetic flux in said core when said outgoing and incoming currents are equal.

4. The fault detector of claim 2, further comprising means for comparing the durations of said time intervals required for said flux to change said core from saturation in one sense to saturation in the other sense with the duration of said time intervals required for said flux to change from saturation in said other sense to saturation in said one sense.

5. The fault detector of claim 4, wherein said means for measuring said time intervals further comprises means for producing width-representative pulses having widths representative of the durations of said current pulses, and said means for comparing the durations of said time intervals comprises up-down counter means for counting in one sense proportionally to the width of one of said width-representing pulses and for counting in the other sense proportionally to the width of the next-following width-representing pulse, whereby any substantial count remaining in the counter after such an up-counting and down-counting is representative of a detected fault.

6. The fault detector of claim 3, wherein said coils of said pair are substantially equal in size, configuration and number of turns, and said outgoing current and said incoming current are supplied to them in opposite senses with respect to the direction of flow around said core.

7. The fault detector of claim 1, wherein said means for measuring said response of said core further comprises: means for sensing differences in the durations of successive voltage pulses produced in response to said pulses of charging current and for producing indications of a fault when said differences exceed a predetermined level.

8. The fault detector of claim 7, further comprising means for sensing the sum of the duration of successive voltage pulses produced in response to said pulses of charging current, and means for indicating a fault when said sum falls below a predetermined level.

* * * * *